United States Patent
Bude et al.

(10) Patent No.: US 7,180,103 B2
(45) Date of Patent: Feb. 20, 2007

(54) III-V POWER FIELD EFFECT TRANSISTORS

(75) Inventors: Jeff D. Bude, New Providence, NJ (US); Peide Ye, High Bridge, NJ (US); Kwok K. Ng, Warren, NJ (US); Bin Yang, Bridgewater, NJ (US)

(73) Assignee: Agere Systems Inc., Allentown, PA (US)

( * ) Notice: Subject to any disclaimer, the term of this patent is extended or adjusted under 35 U.S.C. 154(b) by 90 days.

(21) Appl. No.: 10/948,897

(22) Filed: Sep. 24, 2004

(65) Prior Publication Data
US 2006/0071250 A1    Apr. 6, 2006

(51) Int. Cl.
H01L 29/739    (2006.01)
H01L 31/0328    (2006.01)
H01L 31/0336    (2006.01)
H01L 31/072    (2006.01)
H01L 31/109    (2006.01)

(52) U.S. Cl. .................... 257/200; 257/11; 257/189; 257/201

(58) Field of Classification Search .................. 257/11, 257/189, 200, 201
See application file for complete search history.

(56) References Cited

U.S. PATENT DOCUMENTS

| | | | |
|---|---|---|---|
| 5,559,053 A * | 9/1996 | Choquette et al. ............ 438/41 |
| 2003/0027409 A1 * | 2/2003 | Ramdani et al. ............ 438/481 |
| 2003/0031224 A1 * | 2/2003 | Litvin et al. .................. 372/50 |
| 2003/0218666 A1 * | 11/2003 | Holm et al. ................ 347/130 |
| 2004/0207029 A1 * | 10/2004 | Braddock ................... 257/410 |

OTHER PUBLICATIONS

K. Asano, et al, Novel High Power AlGaAs/GaAs/HFET with a Field-Modulating Plate Operated at 35V Drain Voltage, ULSI Device Development Laboratories, NEC Corporation, 9-1, Japan.
Chang-Lee Chen, et al, High-Breakdown-Voltage MESFET with a Low-Temperature-Grown GaAs Passivation Layer and Overlapping Gate Structure, IEEE Electron Device Letters, vol. 13, No. 6, Jun. 1992, pp. 335-337.

(Continued)

Primary Examiner—Ida M. Soward (57) ABSTRACT

A field effect transistor configured for use in high power applications and a method for its fabrication is disclosed. The field effect transistor is formed of III-V materials and is configured to have a breakdown voltage that is advantageous for high power applications. The field effect transistor is so configured by determining the operating voltage and the desired breakdown voltage for that operating voltage. A peak electric field is then identified that is associated with the operating voltage and desired breakdown voltage. The device is then configured to exhibit the identified peak electric field at that operating voltage. The device is so configured by selecting device features that control the electrical potential in the device drift region is achieved. These features include the use of an overlapping gate or field plate in conjunction with a barrier layer overlying the device channel, or a p-type pocket formed in a region of single-crystal III-V material formed under the device channel. The overlapping gate/field plate or p-type pocket extend into the drift region of the device, controlling the electrical potential of the device in a manner that provides the desired control of the electrical potential in the drift region.

23 Claims, 6 Drawing Sheets

OTHER PUBLICATIONS

Chang-Lee Chen, et al, High-Power-Density GaAs MISFET'S with a Low-Temperature-Grown, Epitaxial Layer as the Insulator, IEEE Electron Device Letters, vol. 12, No. 6, Jun. 1991, pp. 306-308.

H. Hsia, et al, Direct Ion-Implanted 0.12-μm GaAs MESFET with $f_t$ of 121 GHz and $f_{max}$ of 160 GHz, IEEE Electron Device Letters, vol. 20, No. 5, May 1999, pp. 245-247.

Shreepad Karmalkar, et al, RESURF, AlGa/GaN HEMT for High Voltage Power Switching, IEEE Electron Device Letters, vol. 22, No. 8, Aug. 2001, pp. 373-375.

P.D. Ye, et al, GaAs MOSFET With Oxide Gate Dielectric Grown by Atomic Layer Deposition, IEEE Electron Device Letters, vol. 24, No. 4, Apr. 2003, pp. 209-211.

\* cited by examiner

III-V POWER FIELD EFFECT TRANSISTORS

TECHNICAL FIELD

The present invention is directed to field effect transistors for use in high power applications. Specifically, the present invention is directed to III-V semiconductor field effect transistors that can handle large voltages (i.e. 20 volts and larger).

BACKGROUND OF THE INVENTION

Field Effect Transistors (FETs) are ubiquitous devices used in a wide array of applications. Certain applications require FETs which can handle large voltages. For example, RF switches in cell phones require FETs which can sustain more than 20 volts between the source and drain. Power amplifiers in wireless base stations often require FETs which can sustain more than 50 volts between source and drain and between the gate and drain.

Figure 1:
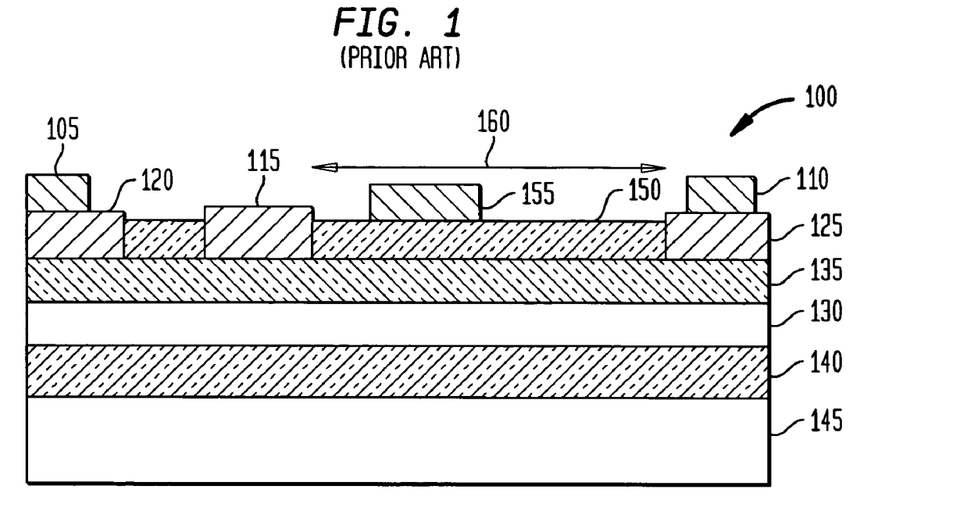
FIG. 1 is a schematic view of a prior art MESFET device.

FETs are transistors where the resistance between the source and drain ($R_{SD}$) is modulated by a gate voltage. FIG. 1 shows a typical GaAs FET 100. The FET illustrated in FIG. 1 has a source contact 105 a drain contact 110 and a gate contact 115. Source contact 105 is in electrical contact with source 120 and drain contact 110 is in electrical contact with drain 125. The FET is formed on a semi-insulating GaAs substrate 145 on which is formed an undoped GaAs buffer layer 140. The device 100 also has a barrier layer 135 formed between the channel 130 and the source 120, drain 125 and gate 115.

When the gate voltage is high enough that the channel isn't fully depleted of charge, the device is in the on-state. In this on-state, $R_{SD}$(on) is low and current flows from the source 120 through the device channel 130 to the drain 125. When the gate voltage is low enough that the channel is depleted of charge, the device is said to be in the off-state. In the off-state, $R_{SD}$(off) is high and little or no current flows through the channel 130.

FIG. 1 is a GaAs MESFET with a semiconducting barrier layer. The semiconducting barrier layer has a higher bandgap energy than that of the underlying channel and is typically used to help reduce gate leakage current. The gate 115 is a Schottky barrier metal that contacts the barrier layer 135 to provide a Schottky insulating junction between the gate and the channel. The passivation layer 150 is deposited between the gate 115 and drain 125 and between the source 120 and gate 115 to reduce surface states in these regions. Surface states lead to undesirable device performance along with stability and reliability problems. A typical surface passivation layer is $SiO_2$. Silicon nitride (SiN) is another example of a typical passivation layer.

Typical semiconductor substrates used to form power transistors are silicon (Si) and large band-gap III-V compound semiconductors. Gallium arsenide (GaAs) and gallium nitride (GaN) are examples of the materials referred to as "III-V" materials herein. III-V substrates have several desirable material properties for use in power FETs when compared to Si. These properties include high electron mobility (which leads to improved high frequency performance and lower $R_{SD}$(on)) and higher bandgap energies (which lead to lower impact ionization and thus higher BV).

Si-based FETs are widely used in power amplifiers for base-stations that require high output power with a corresponding drain to source breakdown voltage ($BV_{DS}$(off)) that is greater than 60 volts, but have higher $R_{SD}$ and lower maximum power gain frequency ($f_{max}$) compared to GaAs FETs. These silicon devices are typically Si LDMOS transistors.

GaAs FETs are typically used in applications when higher speed or lower $R_{SD}$(on) is required but $BV_{DS}$ need not be as high (e.g. when the off-state breakdown voltage $BV_{DS}$(off) is about 20 volts). Metal-Semiconductor-FETs (MESFETs) and High-Electron-Mobility-Transistors (HEMTs) are examples of these devices. Examples of such applications are RF switches and lower power amplifiers used in mobile handsets.

However, in any RF power amplifier application it is desirable either to increase $BV_{DS}$ without increasing $R_{SD}$(on) or to reduce $R_{SD}$(on) without reducing $BV_{DS}$. There are many known approaches for reducing the peak electrostatic field of FETs for use in high power applications to address this objective. One approach is a device known as the RESURF (for reduced surface field) device. RESURF devices are described in Karmalkar, S., et al., "RESURF ALGaN/GaN HEMT for High Power Switching," IEEE Electron Letters, Vol. 22., No. 8 (August 2001). RESURF devices have a p-type region formed below the channel region. The purpose of the p-doped region is to deplete the channel charge when the drain bias is high in order to reduce the peak field in the drift region.

The channel charge can also be depleted by a metal field-plate or overlapping gate. The field plate is placed over the insulator between the gate and the drain. The field plate 155 is illustrated in FIG. 1 and is also described in Asano, K. et al., "Novel High Power AlGaAs HFET with a Field-Modulating Plate Operated at 35 V Drain Voltage," *IEDM*, pp. 59–61 (1998). The field plate 155 is placed in the drift region 160 of the device and is electrically connected to the gate or other voltage source (electrical interconnection not shown in FIG. 1). However, there is a physical gap between the gate electrode 115 and the field plate 155. As discussed in Asano et al, the field plate reduces the peak electric field near the gate edge and therefore increases the breakdown voltage of the device. Specifically, Asano et al. reports an increase in $BV_{GD}$ from 30 V to 47 V and attributes that increase to the presence of the field plate.

Figure 2:
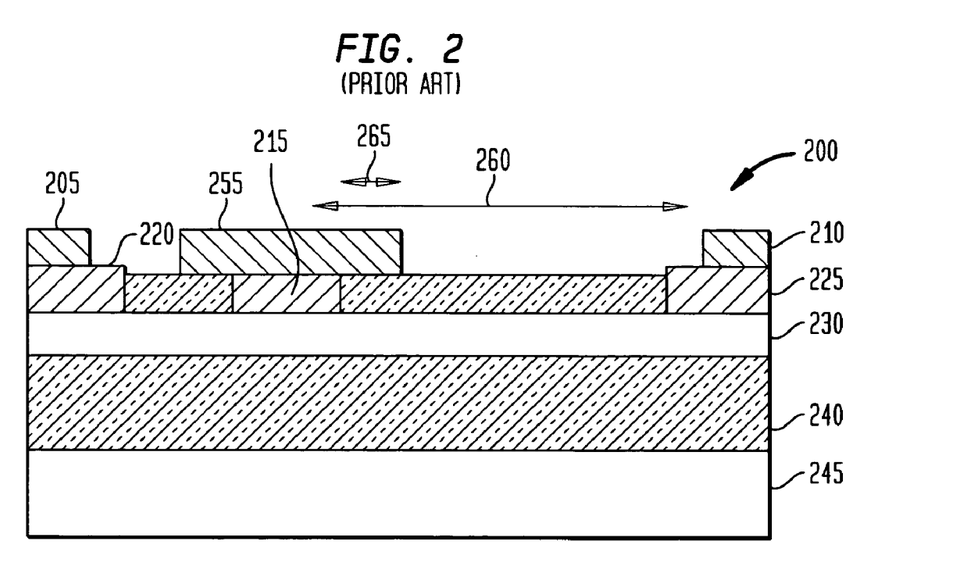
FIG. 2 is a schematic view of a prior art overlap MESFET/MISFET device.

FIG. 2 is a prior art MESFET 200 in which the field plate is configured as an overlapping gate 255. Such a device is described in Chen, Chang-Lee et al. "High-Breakdown Voltage MESFET with a low temperature-grown GaAs Passivation and Overlapping Gate Structure," *IEEE EDL*, Vol. 13 (No. 6) (1992). Chen, Chang-Lee et al. reports an increase in both $BV_{GD}$ (from 25 to 35) and $BV_{DS}$ (from 22 to 37) and attributes the increase to the presence of the overlapping gate in the MESFET. The device in FIG. 2 is otherwise identical to the device in FIG. 1 (with one other exception—the device in FIG. 2 does not have a barrier layer).

However, even with the increases in BV reported above, the reported BV for the devices with field plates/overlapping gates is still far below the BV of silicon-based laterally diffused MOS (LDMOS) devices (i.e. BV of up to 80 volts).

Figure 3:
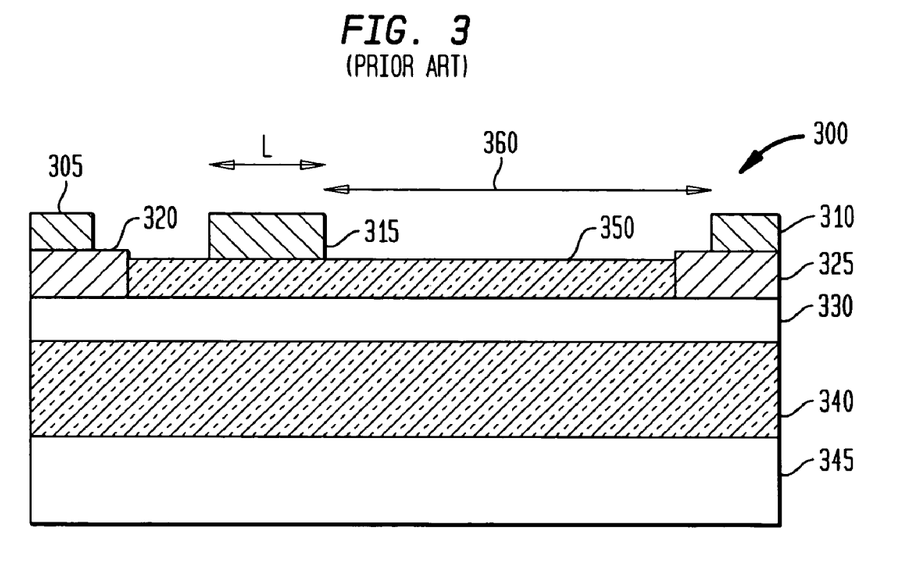
FIG. 3 is a schematic view of a prior art GaAs MISFET.

Other alternatives to the above devices have been proposed. A MISFET device 300 is illustrated in FIG. 3. MISFET 300 is very similar to MESFET 100 (FIG. 1) except for the fact that the gate 315 in MISFET 300 is formed on an insulating barrier layer 350. This barrier layer is also known as a gate insulating layer. Also, MISFET 300 does not have a field plate or overlapping gate.

The barrier layer 350 of MISFET 300 is a low temperature grown (LTG) oxide. However, because the oxide is formed from a III-V material (GaAs) the oxide has too many interface states under the gate 315. These interface states cause undesirable trap-induced effects.

An alternative to the LTG oxide depicted in FIG. 3 was proposed in Ye, P., et al., "GaAs MOSFET With Oxide Gate Dielectric Grown by Atomic Layer Deposition," *IEEE EDL*, Vol. 24, No. 4, p. 209–211 (2003). The insulator material described in this reference was aluminum oxide ($Al_2O_3$) and it was formed on a GaAs substrate. Ye et al. report a breakdown field as high as 9 MV/cm for the device depicted in FIG. 3. The higher breakdown field is due to the fact that the bandgap energy for $Al_2O_3$ is 8 eV compared to 1.4 eV for the LTG GaAs. The insulator material described in this reference had a lower interface state density than the previously described III-V gate oxides.

However, merely inserting a gate oxide into the device, even if that device is the above-described $Al_2O_3$ formed by ALD, is not a global solution to increasing the BV for III-V devices. This is because there are multiple sources of BV for these devices.

Accordingly III-VIII-V devices with improved resistance to BV are still sought.

SUMMARY OF THE INVENTION

The present invention is directed to a III-VIII-V semiconductor FET that has improved $BV_{DS}$ and $BV_{GD}$. As such the devices are particularly suited for high voltage applications. For purposes of the present invention, high voltage applications are those applications where the device is required to handle 20 volts or more in a regular operating environment. In typical high voltage applications, the devices are regularly required to handle 50 volts or more.

The device of the present invention is configured to provide advantageous electrostatic control of the electrical potential of the device in the drift region. For purposes of the present invention, the drift region is the region of the device between the drain edge of the gate and the drain of the device. The design of the drift region is balanced to achieve the dual objectives of high $BV_{DS}$ and device reliability versus high performance. A longer drift region provides a higher $BV_{DS}$ and better reliability, but lengthening the drift region adversely affects device performance. The present invention identifies a methodology for determining the appropriate design of the drift region to achieve this dual objective.

Basically, the invention identifies certain device features that provide the above-described electrostatic control. In one embodiment, the invention is a GaAs passivation layer formed by ALD (atomic layer deposition) in combination with either an overlapping gate or a field plate. A field plate is on the underlying passivation layer but not on or otherwise in contact with the device gate. An overlapping gate is on and in contact with the gate but extends beyond the gate and is on and in contact with the underlying passivation layer.

In the context of the present invention, the field plate or overlapping gate must have a length $L_{OG}$ over the passivation layer and a thickness of the passivation layer ($h_{OG}$) that are selected to provide the desired $BV_{DS}$ for a given operating voltage. This is accomplished by first identifying a peak field of the device that, for a given $V_{DS}$, will provide the desired $BV_{DS}$ at the selected $V_{DS}$. For example, when $V_{DS}$ is 80 volts or less, a peak field of about 400 kV/cm will provide a III-VIII-V device with the desired $BV_{DS}$.

In a second embodiment of the present invention, a p-type pocket is provided in a crystalline GaAs layer formed between the bulk substrate and the channel layer. This pocket extends laterally beneath the drift region from about the gate to some point between the gate and the drain. Since the p-type pocket is not a layer but is laterally confined, the p-type pocket must be introduced through known techniques of masked diffusion or ion implantation. The mask is lithographically defined. If the device has the pocket, the device is not required to have the ALD passivation layer, although it is advantageous if the device has the passivation layer formed by ALD in addition to the pocket. The placement of the p-type pocket is again governed by the desire to lower the peak fields in the device. In this embodiment, it is also advantageous if an overlapping gate or field plate is provided to maintain the peak field of the device at a level that will provide a device with the desired $BV_{DS}$ (e.g. about 400 kV/cm or less during normal device operating conditions when $V_{DS}$ is less than about 80V). Hence, in this embodiment, the device can be either a MOSFET (oxide interposed between gate metal and semiconductor) or a MESFET (gate metal directly in contact with semiconductor). For purposes of placement and dimension, it is advantageous if the p-type pocket is formed no deeper than 0.5 μm below the channel of the III-VIII-V FET. Furthermore, it is advantageous if the pocket extends no further than one-third of the distance between the gate and the drain.

In either embodiment, advantageous additional features include a hole sink. In the context of the present invention, this hole sink is provided in the form of a p+ substrate or a p+ region formed adjacent to the source region of the device (typically referred to as a p+ sinker).

BRIEF DESCRIPTION OF THE DRAWINGS

In the drawings wherein like reference numerals denote similar elements throughout the views.

DETAILED DESCRIPTION

The present invention is directed to a III-VIII-V device specifically configured for use in high voltage (i.e. 20 volts or higher) applications and a method for determining its configuration. Specifically, the particulars of the high voltage environment (e.g. $V_{DS}$ and $BV_{DS}$) are first identified. A peak electric field is then identified that will provide a device that will satisfy the breakdown voltage requirement and provide a device with the requisite reliability. The device is then configured to provide a peak electric field at the identified value of $V_{DS}$.

In order to illustrate this methodology a sample $V_{DS}$ and a target $BV_{DS}$ (off) for that $V_{DS}$ are first selected. For purposes of illustration a $BV_{DS}$ (off) of about 80V is selected and the peak electric field in the drift region is then examined in the off-state for a $V_{DS}$ of 80 volts. These values were selected to demonstrate that a III-VIII-V device with a breakdown voltage equivalent to that found in silicon-based devices can be obtained. Certain device features are then configured such that the peak electrostatic field in the drift region is 400 kV/cm and preferably less when $V_{DS}$=80V.

The present invention identifies a combination of features that provide a III-VIII-V device for high power applications with an unprecedented BV by providing devices with superior electrostatic control of the drift region potential. The most important performance factors for RF power FETs are $R_{SD}$(on), the maximum power gain frequency ($f_{max}$) the output conductance ($G_{SD}=\partial I_D/\partial V_{DS}$) and breakdown voltage (BV). To extract high power efficiently from power FETs at high frequency (about 1 GHz or greater) the FET must have a low $R_{SD}$(on), a high $f_{max}$, a low $G_{SD}$ and a high breakdown voltage (BV).

Two breakdown voltages are important for this analysis. The first is the drain to source breakdown voltage ($BV_{DS}$) which is the largest bias the device can sustain between source and drain with an acceptable output conductance. The second is $BV_{GD}$ which is the largest bias the device can sustain between gate and drain with a low gate current.

Drain to source breakdown generally occurs as a result of the impact ionization of electrons accelerated between the source and the drain. Impact ionization becomes large when electric fields in the FET channel become large. High values of $V_{DS}$ generate high electric fields causing impact ionization and eventually device breakdown. Gate to drain breakdown is also the result of high fields from the gate to the drain when $V_{GD}$ is high. It results both from impact ionization between the gate and drain and from large tunnel currents from the gate to the channel. Sometimes, a breakdown event is reversible and sometimes it is destructive. In either situation, gate and drain biases must be reduced below BV to ensure a safe operating margin.

The present invention defines certain parameter ranges that provide advantageous electrostatic control of the electrical potential in the device drift region. In one embodiment, described with reference to FIG. 4A, the device is a III-VIII-V MESFET 400 having a source 420 and source contact 405, drain 425 and drain contact 410 and gate 415 formed on channel layer 430. The channel layer 430 in this example is n-type GaAs. In alternate embodiments, the channel layer 430 is a composite layer in which a semiconductor barrier layer is formed above the n-type channel. The source 420 and drain 425 are n⁺ GaAs and are optional. The source 405 and drain 425 contacts are not optional and contact either the source and drain, respectively, if present, or directly contact the channel 430. The channel layer 430 is over an epitaxial layer 440 of p⁻ GaAs, which in turn is formed on the p⁺ GaAs substrate 445. Channel layer 430 is, typically, also formed epitaxially. A backside substrate contact 460 is provided to directly contact the p⁺ substrate. A p-pocket 441 is formed in the epitaxial layer 440. The level of dopant concentration in the p⁻ layer is at least 2 e¹⁵cm⁻³.

Figure 4A:
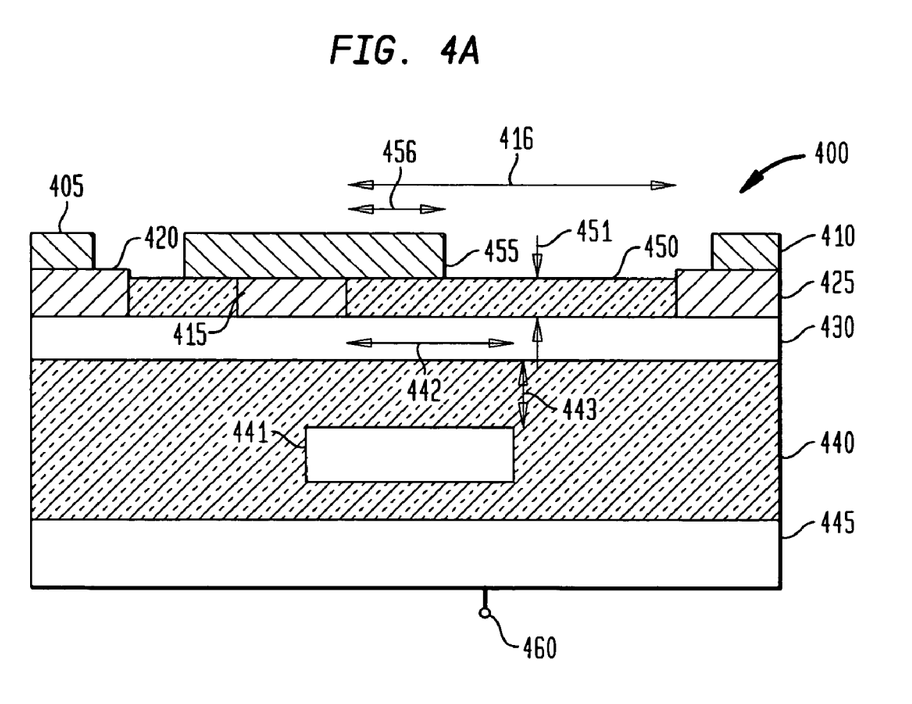
FIG. 4A is a schematic of a III-VIII-V MESFET device according to one embodiment of the present invention.

MESFET 400 also has an overlapping gate 455 formed over and in electrical contact with the gate 415. The overlapping gate is also formed on a passivation layer 450. The passivation layer 450 is interposed between the gate 415 and the source 420 and the gate 415 and the drain 425. The thickness 451 of the passivation layer is designated as $h_{OG}$ and is also the measure of the distance that separates the overlapping gate 455 from the channel 430. The distance 456 that the overlapping gate 455 extends from the gate 415 edge into the drift region 416 is designated $L_{OG}$. The distance 442 that the p-pocket 441 extends from the gate into the drift region 416 is designated $L_{POCK}$ and the depth 443 of the p-pocket 441 in the epitaxial GaAs layer 440 is designated $d_{POCK}$. The p⁻type pocket is formed by further implant of a dopant species in the GaAs epitaxial layer. The dopant is again a p-type dopant species and the total dopant dose (concentration multiplied by the thickness of the pocket) is at least $10^{12}$ cm⁻². It is advantageous if the total dopant dose in the p-pocket is comparable in magnitude, (but not in dopant type) to the total dopant dose in the drift region.

Figure 4B:
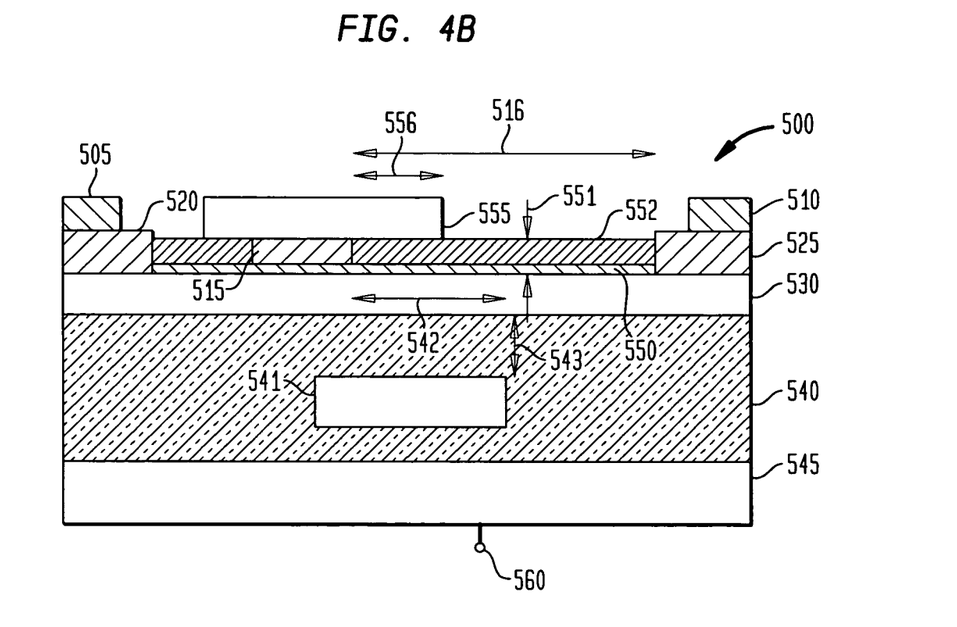
FIG. 4B is a schematic of a III-VIII-V MOSFET device according to another embodiment of the present invention.

The values of $L_{OG}$ and $h_{OG}$ are selected so that the peak field in the drift region is less than about 400 kV/cm when $V_{DS}$=80V. The values of $L_{OG}$ and $h_{OG}$ depend upon the characteristics of a particular device. In one illustrative example, applicants chose to simulate the performance of devices depicted in FIGS. 4A and 4B. The device in FIG. 4B is identical to the device in FIG. 4A, except that a gate insulating layer 550 is interposed between the gate 515 and the channel 530. The passivation layer 552 lies above the gate insulating layer 550 but does not extend under the gate 515. The passivation layer 552 may be the same material as the gate insulating layer. In devices without an overlapping gate or a field plate the passivation layer is optional. Thus, FIG. 4B is the MOSFET alternative to the MESFET depicted in FIG. 4A. To the extent device elements are repeated from FIG. 4A, those elements are given a corresponding 500-series number (e.g. source 405 in FIG. 4A is 505 in FIG. 4B.)

Although applicants do not wish to be held to a particular theory, applicants believe that the difference in breakdown voltage is due in part to the fact that, in the silicon-based LDMOS devices, there is an insulator between the gate and the channel. By contrast, the overlapping gate or field plate MESFETs have a Schottky barrier between the gate and the channel. Insulators have a higher breakdown field than the Schottky barrier formed between the III-VIII-V channel and the Schottky metal (i.e. the field plate or overlapping gate). If the dominant breakdown mechanism for III-VIII-V high power devices is gate breakdown, inclusion of a good gate insulator is a possible solution.

The performance of the devices depicted in FIGS. 4A and 4B were simulated using a standard device simulation package. Both MOSFET and MESFET structures were simulated. For the MOSFET structure, the gate insulator layer was $Al_2O_3$ having a thickness of 160 Angstroms. For purposes of the simulations, the passivation layer was either an $Al_2O_3$ material or an $SiO_2$ layer. The $Al_2O_3$ material was modeled to have been deposited by ALD. That is, the surface states of the passivation layers were presumed to be the surface states that would result if the passivation layers were formed by ALD. For purposes of the simulation, the gate length ($L_g$) was selected as 1 μm and the drift region was selected to be 3 μm.

In order to determine the effects of the values of $L_{POCK}$, $d_{POCK}$, $L_{OG}$ and $h_{OG}$ on the gate field and peak electric field in the drift region, these parameters were varied for the various simulations summarized in the following Table 1. The gate and peak fields were computed when the device was in the off-state and $V_{DS}$=80V. In the simulations for which a particular parameter is indicated as NA, the value of that particular parameter was not included in the simulation. This was done to isolate the effect of the particular parameter under investigation on the electrical fields (and in particular the peak electric field) of the device.

TABLE 1

Simulation Results

| Device Type | | Passivation Layer | $L_{OG}$ (um) | $H_{OG}$ (um) | $L_{POCK}$ (um) | $d_{POCK}$ (um) | Gate Field kV/cm | Peak Field kV/cm |
|---|---|---|---|---|---|---|---|---|
| Set 1: MOSFET | A | ALD $Al_2O_3$ | NA | NA | 0.75 | 0.2 | 386 | 386 |
| | B | ALD $Al_2O_3$ | NA | NA | 0.75 | 0.4 | 525 | 525 |
| | C | ALD $Al_2O_3$ | NA | NA | 0.75 | 1.0 | 735 | 735 |
| | D | ALD $Al_2O_3$ | NA | NA | 1.5 | 0.2 | 880 | 880 |
| Set 2: MOSFET | A | ALD $Al_2O_3$ | 0.75 | 0.2 | NA | NA | 430 | 430 |
| | B | ALD $Al_2O_3$ | 0.75 | 1.2 | NA | NA | 610 | 610 |
| | C | $SiO_2$ | 0.75 | 0.2 | NA | NA | 623 | 623 |
| | D | ALD $Al_2O_3$ | 1.5 | 0.2 | NA | NA | 607 | 655 |
| Set 3: MESFET | A | ALD $Al_2O_3$ | NA | NA | 0.75 | 0.2 | 280 | 380 |
| | B | ALD $Al_2O_3$ | NA | NA | 0.75 | 0.4 | 637 | 637 |
| | C | ALD $Al_2O_3$ | NA | NA | 0.75 | 1.0 | 872 | 872 |
| Set 4: MESFET | A | ALD $Al_2O_3$ | 0.75 | 0.2 | NA | NA | 545 | 545 |
| | B | ALD $Al_2O_3$ | 0.75 | 1.2 | NA | NA | 770 | 770 |
| | C | $SiO_2$ | 0.75 | 0.2 | NA | NA | 830 | 830 |

For the simulations in which $d_{POCK}$ was varied and $L_{POCK}$ was held constant, the results demonstrate that, the closer $d_{POCK}$ is to the channel, the lower the gate field and the peak electric field are in the drift region. This demonstrates that the pocket works to deplete the channel charge. Note that an increase in the value of $L_{POCK}$ also causes the electric fields to increase significantly. This is seen by comparing Set 1 devices A and D in which $L_{POCK}$ has been increased from 0.75 to 1.5 um. When $L_{POCK}$ is increased to 1.5 um, the fields become unacceptably large. So much so that further reduction in the depth of $d_{POCK}$ no longer adequately compensates for the increase and the desired peak field (i.e. below 400 kV/cm) cannot be achieved.

These results demonstrate that $d_{POCK}$ has a demonstrable effect on the electric fields in the device region. Thus the value of $d_{POCK}$ is selected to provide the peak electric field in the drift region specified herein. In this regard, the pocket can actually extend into the channel region as long as the channel current is not significantly reduced. One skilled in the art can determine the necessary trade-off between the benefit of having the pocket extend into the channel region to control electric fields in the drift region and any negative impact on channel current as a result of this configuration. Generally, the higher the dopant concentration in the channel, the closer the pocket should be to the channel. Also, for purposes of the impact on the electric field in the drift region, there is no advantage to having the p-pocket extend under the gate beyond the drain side of the gate. That is, the p-pocket need only extend into the drift region from the drain side of the gate and not from some point closer to the source. Thus, although the devices in FIGS. 4A and 4B illustrate the pocket as extending somewhat under the gate, this is not required, nor even advantageous (beyond ensuring that the p-pocket is indeed positioned under the drain-side edge of the gate).

Based upon the foregoing, it is advantageous if the $d_{POCK}$ is less than 0.5 μm and $L_{POCK}$ is no more than ⅓ the distance of the drift region 416. This is true for either embodiment depicted in FIGS. 4A and 4B. Furthermore, it is advantageous if the total dopant dose in the pocket be at least about $10^{12}/cm^2$. The peak doping concentration of the p-pocket should be at least $5 \times 10^{16}$ $cm^{-3}$. Again it is advantageous if the total dopant dose in the p-pocket is comparable in magnitude (but not in dopant type) to the total dopant dose in the drift region. Since the epitaxial layer 440 in which the p-pocket is formed is a III-VIII-V material, it is advantageous if the p-pocket dopant is beryllium (Be). One skilled in the art is well aware of numerous techniques that can be used to introduce such dopants into such materials. Consequently implantation techniques are not described herein.

The effect of the values of $L_{OG}$ and $h_{OG}$ on the electric fields in the drift region were also evaluated. Again, simulations were made for the MESFET device depicted in FIG. 4A and the MOSFET depicted in FIG. 4B. Table 1 describes the field magnitudes in MOSFETs in which the passivation layer was $Al_2O_3$. For two simulations $L_{OG}$ was 0.75 μm. When $h_{OG}$ was increased from 0.2 μm to 1.2 μm the peak field was observed to increase dramatically. In another simulation, the $Al_2O_3$ was replaced with $SiO_2$ and the $h_{OG}$ was 0.2 μm.

Again, a significant increase in peak field was observed as a result of this change. This observed increase is attributed to the fact that $Al_2O_3$ has a much higher relative dielectric constant (K=9) than $SiO_2$ (K=3). The critical parameter is the "electrical thickness" of the passivation film. Herein, the electrical thickness is defined to be the equivalent thickness with respect to the dielectric constant of $Al_2O_3$. Specifically, the electrical thickness ($E_T$) is calculated relative to $Al_2O_3$. That is, the ratio of the dielectric constant of $Al_2O_3$ to the dielectric constant of the passivation film, times the thickness of the film, yields $E_{(T)}$. This is also expressed as $K_{(Al2O3)} h_{OG}/K_f$, or 9 ($H_{OG}/K_f$) where $K_f$ is the average dielectric constant of the passivation film. Consequently, even when the value of $h_{OG}$ is small, the smaller K of $SiO_2$ has the effect of increasing the electrical thickness of $h_{OG}$. The passivation layer may be composed of multiple layers of different materials having different values of K. In such a case, K for the passivation layer is understood by those skilled in the art to be the effective dielectric constant of the layer. In particular, it is advantageous if $E_T$ is less than about 0.3 um.

In yet another MOSFET simulation, $L_{OG}$ was increased to 1.5 μm. The effect was observed to be analogous to the observed effect when $L_{POCK}$ was increased. It is clear that for an OG MOSFET, $h_{OG}$ must be thicker than the gate oxide thickness. From the foregoing, it is advantageous if, for the embodiments of the present invention that possess an overlapping gate 455 (FIG. 4A), 555 (FIG. 4B), that the overlapping gate extend no further than about one-third of the distance into the drift region (e.g. 416 in FIG. 4A). It is also advantageous if the value of $h_{OG}$ is such that the $h_{OG}$ divided by K for the passivation layer is about 0.3 µm or less. Preferably $h_{OG}/K$ is 0.1 µm or less. In this regard, it is advantageous if the passivation layer is made of a material having a dielectric constant that is greater than about 5. It is also advantageous if the passivation layer is deposited by ALD to reduce the interface state (i.e. trap) density associated with prior art passivation layers such as those described in Chen et al.

Table 1 further describes simulations similar to those described above but for the MESFET depicted in FIG. 4A. That is, the effect of variations in $L_{OG}$, $h_{OG}$ and passivation layer on the electric fields in the drift region were simulated and the results are reported in Table 1. For the MESFET, as for the MOSFET, increases in peak electric field were observed with an increase in $h_{OG}$ and when the higher K $Al_2O_3$ passivation layer was replaced with the lower K $SiO_2$ passivation layer. All other things being equal, the MESFET embodiment has a higher peak field than an otherwise identical MOSFET (the breakdown field of the MOSFET oxide is higher than the Schottkey gate breakdown field in the MESFET).

Figure 4C:
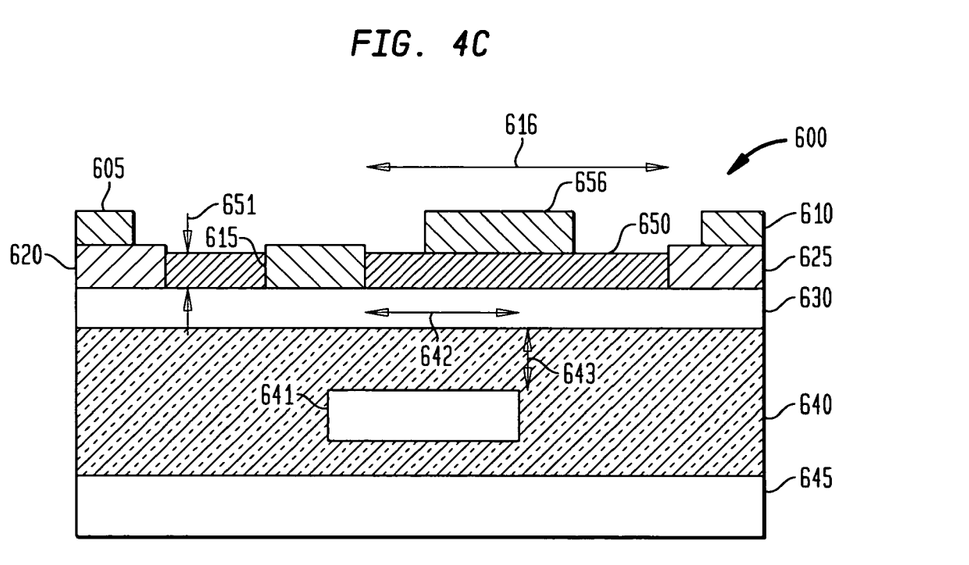
FIG. 4C is a schematic of a III-VIII-V MESFET device according to a third embodiment of the present invention.

In another embodiment, the overlapping gate 455 depicted in FIG. 4A is replaced by a field plate structure 656 depicted in FIG. 4C. Again, to the extent a device element is repeated from FIG. 4A it is given a corresponding 600-series number in FIG. 4C (e.g. source 405 in 4A is 605 in 4C). FIG. 4C depicts the field plate in a MESFET structure. In an alternate embodiment (not shown) the field plate is incorporated into a MOSFET structure. In this embodiment it is again advantageous if the passivation layer 650 is an ALD deposited oxide to reduce the interface state density. It is advantageous if the oxide is an oxide with a high K such as $Al_2O_3$. One advantage of the field plate structure is that, when grounded to the device source, the drain capacitance is screened from the gate.

Figure 8:
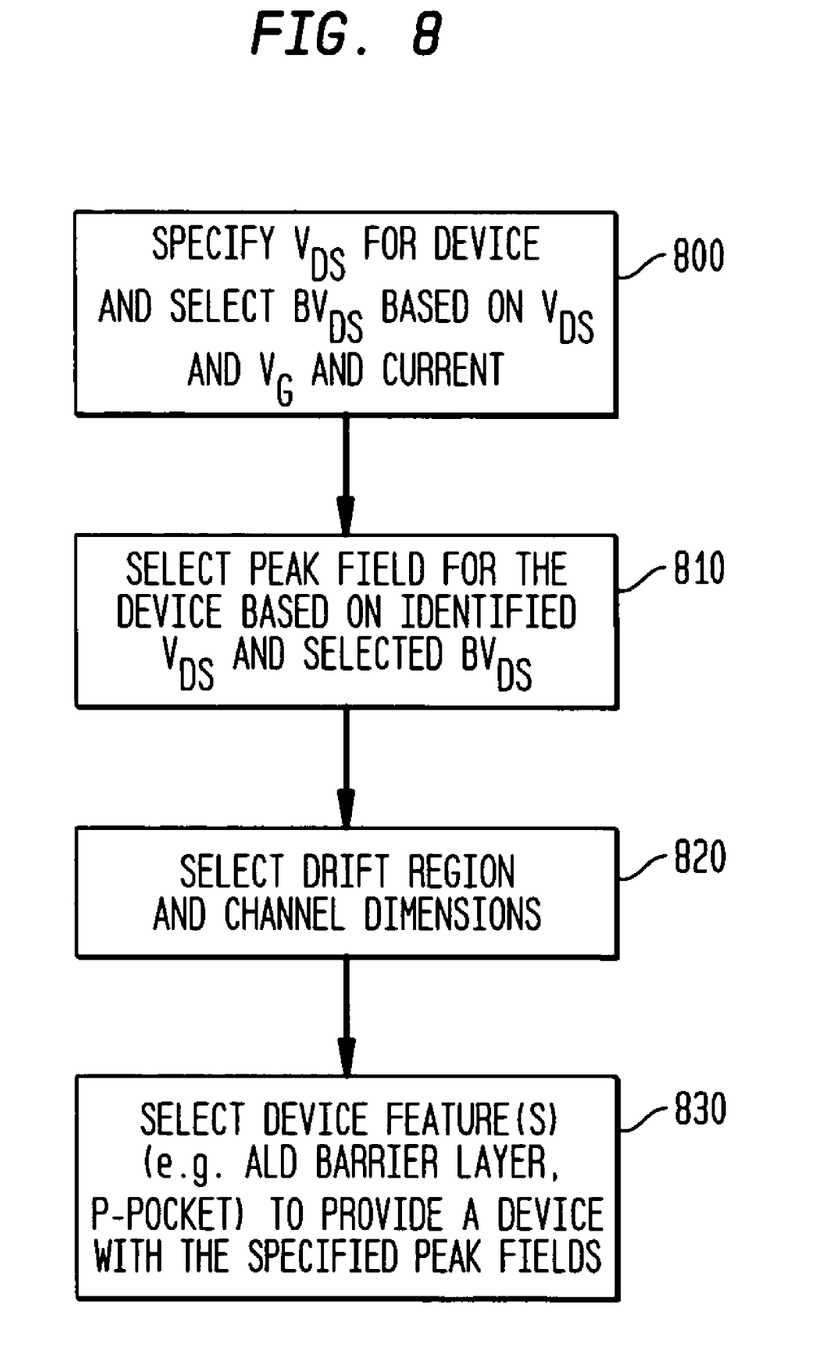
FIG. 8 is a flow chart describing the method of the present invention by which a III-VIII-V device that is suitable for high voltage applications is designed.

Although most of the simulation results reported in Table 1 have a peak breakdown field higher than the desired peak field of 400 kV/cm, Table 1 illustrates the methodology whereby one skilled in the art can obtain a III-VIII-V device with a peak breakdown field, and, more importantly, a BV that will satisfy the requirements for high voltage applications. Referring to the flow chart in FIG. 8, the first step 800 is to identify the maximum operating voltage ($V_{DS}$) of the device. In high voltage applications, this will be greater than 20 V, and typically in excess of 50 V. Based upon the operating voltage, a $BV_{DS}$ of the device is also selected. Typically $BV_{DS}$ is higher than $V_{DS}$. In step 810, a peak field for the device is selected based upon the desired $BV_{DS}$. In step 820, dimensions for the channel and drift region are selected. As previously noted, drift region dimensions are selected by balancing the benefit of a longer drift region vis-à-vis $BV_{DS}$ with the adverse effects that a longer drift region has on device performance (higher $I_{ON}$ and longer device response time). The doping in the channel is also selected to provide the device with the desire $I_{on}$. In high voltage applications, $I_{on}$ is advantageously greater than about 100 µA/µm. In step 830, device features are selected to provide a device with the desired peak field. The features selected are either an ALD barrier layer/gate dielectric layer in combination with either a field plate of a p-pocket. In the case of a p-pocket, it can be employed independently from the ALD barrier layer to achieve the objectives of the present invention.

Although the embodiments described thus far have been depicted as formed on a $p^+$ substrate, with an electrical connection between the source and the substrate, the present invention contemplates semi-insulating substrates as well. In the present invention the same approach can be used to control the peak fields for devices formed on $p^+$ and semi-insulating substrates.

Although the substrate type has little effect on the breakdown voltage of devices in the off-state it can have a large effect on the characteristics of the device in the on-state. When electric fields in the drift region are large and there is an electron current flowing from the source to the drain, holes are generated by impact ionization. These holes must flow out of the device through a low voltage electrode. In a MOSFET formed on a SI substrate, the holes must exit the device through the source contact. In a MESFET on a SI substrate they can exit through the source and through the gate electrodes. In either case, if the holes see a large net impedance to ground, a net hole charge can build in the bulk of the device that will alter the potential under the gate and result in an undesirable effect on the device characteristics. In particular, the drain current can exhibit a "kink" and a large output conductance ($G_{DS}$). These holes eventually will lead to a snap-back bipolar-induced breakdown.

Figure 5:
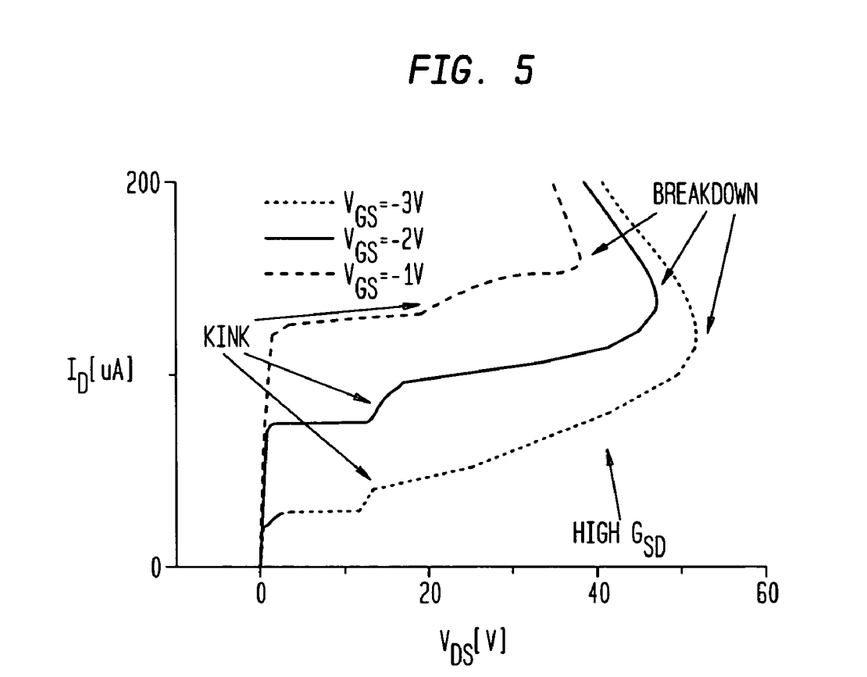
FIG. 5 is an III-VI–V curve for a simulated device formed on a semi-insulating substrate.
Figure 6:
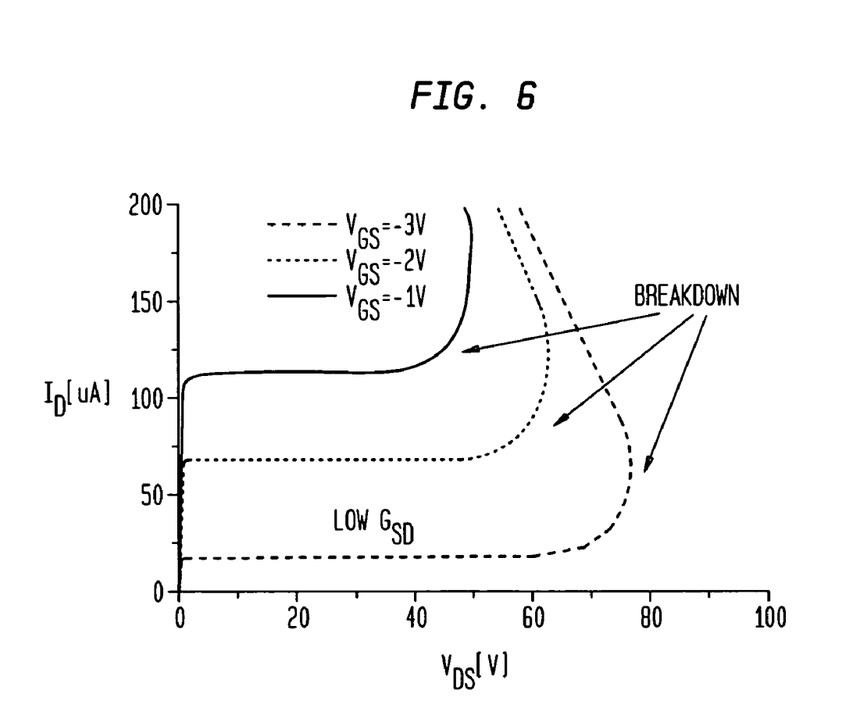
FIG. 6 is an III-VI–V curve for a simulated device formed on a p$^+$ III-VIII-V substrate.

Simulations were performed from which the III-VI-V curves were obtained for III-VIII-V MOSFETs formed on silicon and $p^+$ substrates. The MOSFET simulated here shares the properties of the device simulated for the results reported in Table 1, Set 1, Device A. From the results of the simulations (using gate voltages of −1, −2, and −3 volts) III-VI-V curves were obtained and are illustrated in FIGS. 5 and 6.

Semi-insulating substrates cause all holes to exit through the source electrode. From the III-VI-V curve in FIG. 5, a relatively large impedance for the holes to ground is observed from the kink effect and large $G_{DS}$ illustrated in FIG. 5.

The same device was simulated with a $p^+$ substrate. Again, an III-VI-V curve was obtained from the simulations as described above. The resulting III-VI-V curves illustrated in FIG. 6 are free of the kink effect and show very small $G_{DS}$. Similar results were observed from simulations of MESFET structures on SI and $p^+$ substrates. In this device having a $p^+$ substrate and a substrate contact, the holes can also exit the device through the substrate contact.

Thus, contrary to conventional wisdom which favors semi-insulating III-VIII-V substrates because they reduce drain capacitance, applicants have discovered that forming III-VIII-V devices on $p^+$ substrates provides certain advantages. Specifically, the $p^+$ substrate provides an electrical sink for holes, which is very important for high BV(on). This is particularly true for MOSFETs, because, due to the fact that the MOSFET has no gate sink for holes, the hole impedance to ground is higher for a MOSFET than for a MESFET.

Therefore, it is a further aspect of the current invention to form III-VIII-V MOSFETs and MESFETs on $p^+$ substrates.

Figure 7:
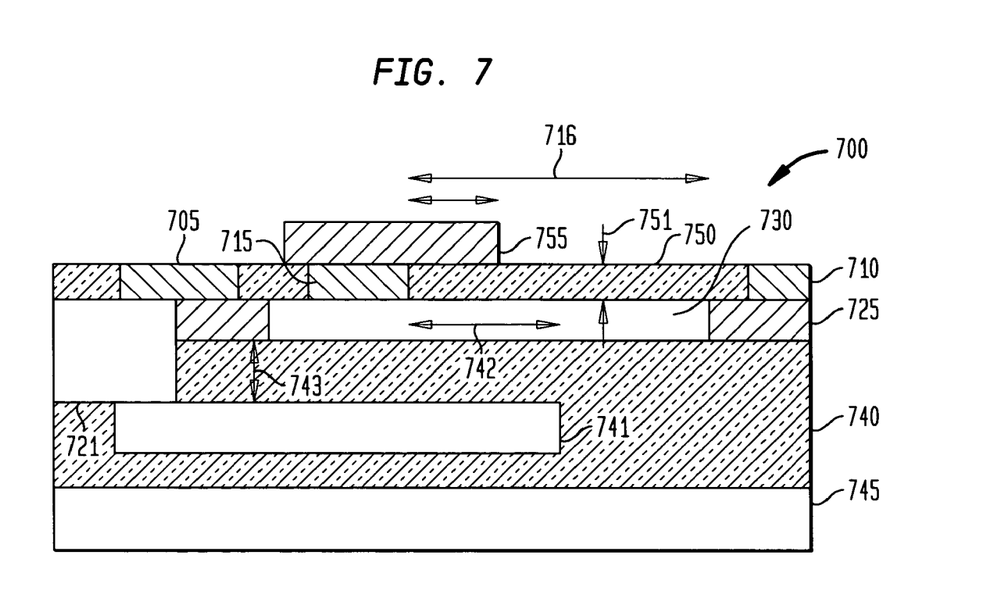
FIG. 7 is a schematic of a III-VIII-V MESFET device of the present invention according to a fourth embodiment.

Another embodiment of the present invention is illustrated in FIG. 7. To the extent that the device elements from FIG. 4C are repeated in FIG. 7, those elements are given a corresponding 700-series number. The device depicted in FIG. 7 is a MESFET 700 with an overlapping gate 755. A top side p-contact 721 is provided near the source to collect holes (i.e. to function as an electrical sink for holes). The p contact is $p^+$ GaAs having a doping concentration of at least $10^{17}$ cm$^{-3}$. The top-side contact 721 is connected to the source contact 705 and thus, the source voltage. In this configuration it is not required that the substrate be $p^+$ to achieve the advantages of the $p^+$ substrate described above. In this embodiment the substrate 745 is either a $p^+$ substrate or a semi-insulating substrate. In fact, in this embodiment the semi-insulating substrate is somewhat advantageous because it has superior drain capacitance compared to the p+ substrate. The p-sink can be formed by implantation of a suitable p-type dopant such as Be.

The hole sink 721 depicted in FIG. 7 is in electrical contact with the buried p-pocket 741. It is a further aspect of the current invention that the hole sink be used in FETs formed on p+ substrates.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A semiconductor device comprising:
    a III-VIII-V semiconductor substrate;
    a III-VIII-V channel layer formed over said substrate;
    a passivation layer comprising an insulating material formed over said channel layer;
    source and drain regions comprising source and drain contacts formed over said channel layer the source region in electrical contact with a source contact and the drain region in electrical contact with a drain contact;
    a gate electrode formed over the channel layer and in contact with the passivation layer wherein the device has a drift region which is the region between the gate electrode and the drain region;
    a second electrode formed over and in contact with the passivation layer, the second electrode extending into the drift region;
    wherein the passivation layer has an electrical thickness ($E_T$) that is calculated relative to a layer of $Al_2O_3$ and is the thickness of the passivation layer (t) multiplied by the ratio of the dielectric constant of $Al_2O_3$ to the average dielectric constant(K) of the passivation layer such that $E_T$ is less than about 0.3 µm and further that the passivation layer is an oxide formed by atomic layer deposition.

2. The device of claim 1 wherein the device is configured to have a peak field of 400 kV/cm at a $V_{DS}$ of 80 volts or less.

3. The device of claim 1 further comprising an overlapping gate in electrical contact with the gate and extending from the gate into the drift region, wherein the passivation layer is interposed between the portion of the overlapping gate extending into the drift region and the channel.

4. The device of claim 1 further comprising a field plate which is formed over the passivation layer in the drift region of the device, wherein the field plate is not in physical contact with either the drain contact or the gate.

5. The device of claim 3 wherein a p-type region is formed in a layer of single crystal III-VIII-V material and in proximity to the channel layer formed over the single crystal III-VIII-V layer, wherein the proximity of the p-type region is selected so that at least some portion of the p-type region is no more than about 0.5 µm from the device channel and wherein at least a portion of the p-type region extends from a region proximate the drain side of the device gate into the drift region of the device.

6. The device of claim 5 wherein the p-type region extends into the drift region by a distance that does not exceed about one-third the distance of the entire drift region.

7. The device of claim 6 wherein the total dopant dose in the p-type region is at least about $10^{12}$ atoms/$cm^2$.

8. The device of claim 7 wherein the p-type dopant is Beryllium.

9. The device of claim 4 wherein a p-type region is formed in the layer of single crystal III-VIII-V material in proximity to the channel layer formed thereover, wherein the proximity of the p-type region is selected so that at least some portion of the p-type region is no more than about 0.5 µm from the device channel and wherein at least a portion of the p-type region extends from a region underneath the device gate into the drift region of the device.

10. The device of claim 9 wherein the p-type region extends into the drift region by a distance that does not exceed about one-third the distance of the entire drift region.

11. The device of claim 1 wherein the passivation layer has an electrical thickness $E_T$ that is 0.2 µm or less.

12. The device of claim 1 wherein the substrate is selected from the group consisting of semi-insulating III-VIII-V substrates and p+ III-VIII-V substrates.

13. The device of claim 12 wherein the device has a semi-insulating substrate and further comprises a hole-sink in proximity to the source contact.

14. The device of claim 13 further comprising a p+ region is formed in the layer of single crystal III-VIII-V material in proximity to the channel layer formed thereover, wherein the proximity of the p-type region is selected so that at least some portion of the P+ region is no more than about 0.5 µm from the device channel and wherein at least a portion of the p-type region extends from a region underneath the device gate into the drift region of the device and wherein the hole-sink is a p-type III-VIII-V region configured to contact the source region and the p+ region.

15. A semiconductor device comprising:
    a III-VIII-V semiconductor substrate;
    a III-VIII-V channel layer formed over said substrate;
    a passivation layer comprising an insulating material formed over said channel layer;
    source and drain regions comprising source and drain contacts formed over said channel layer;
    a gate electrode formed over the channel layer and in contact with the passivation layer wherein the device has a drift region which is the region between the gate electrode and the drain region;
    a second electrode formed over and in contact with the passivation layer, the second electrode extending into the drift region;
    wherein a p-type region is formed in the layer of single crystal III-VIII-V material in proximity to the channel layer formed thereover, wherein the proximity of the p-type region is selected so that at least some portion of the p-type region is no more than about 0.5 µm from the device channel and wherein at least a portion of the p-type region extends from a region underneath the device gate into the drift region of the device.

16. The device of claim 15 wherein the passivation layer has an electrical thickness ($E_T$) that is the product of the dielectric constant of $Al_2O_3$ and the thickness of the passivation layer (t) divided by the dielectric constant (K) of the passivation layer ($E_T = K_{Al2O3} \cdot t/K$) such that $E_T$ is less than about 0.3 µm and is an oxide formed by atomic layer deposition.

17. The device of claim 16 wherein the device is configured to have a peak field of 400 kV/cm at a $V_{DS}$ of 80 volts or less.

18. The device of claim 15 wherein the p-type region extends into the drift region by a distance that does not exceed about one-third the distance of the entire drift region.

19. The device of claim 16 wherein the total dopant dose in the p-type region is at least about $10^{12}$ atoms/cm$^2$.

20. The device of claim 19 wherein the p-type dopant is Beryllium.

21. The device of claim 15 wherein the substrate is selected from the group consisting of semi-insulating III-VIII-V substrates and p$^+$ III-VIII-V substrates.

22. The device of claim 21 wherein the device has a semi-insulating substrate and further comprises a hole-sink in proximity to the source.

23. The device of claim 22 further comprising a p-type region formed in the layer of single crystal III-VIII-V material in proximity to the channel layer formed thereover, wherein the proximity of the p-type region is selected so that at least some portion of the p-type region is no more than about 0.5 μm from the device channel and wherein at least a portion of the p-type region extends from a region underneath the device gate into the drift region of the device and wherein the hole-sink is a p-type GaAs region configured to contact the source region and the p-type region.

* * * * *

UNITED STATES PATENT AND TRADEMARK OFFICE
CERTIFICATE OF CORRECTION

PATENT NO.         : 7,180,103 B2
APPLICATION NO. : 10/948897
DATED                 : February 20, 2007
INVENTOR(S)       : Jeff D. Bude et al.

It is certified that error appears in the above-identified patent and that said Letters Patent is hereby corrected as shown below:

Column 3, line 21, "III-VIII-V" should read --III-V--.
Column 3, line 26, "III-VIII-V" should read --III-V--.
Column 3, line 64, "III-VIII-V" should read --III-V--.
Column 4, line 22, "III-VIII-V" should read --III-V--.
Column 4, line 39, "III-VIII-V" should read --III-V--.
Column 4, line 41, "III-VIII-V" should read --III-V--.
Column 4, line 43, "III-VIII-V" should read --III-V--.
Column 4, line 45, "III-VI-V" should read --I-V--.
Column 4, line 47, "III-VI-V" should read --I-V--.
Column 4, line 48, "III-VIII-V" should read --III-V--.
Column 4, line 49, "III-VIII-V" should read --III-V--.
Column 4, line 50, "III-VIII-V" should read --III-V--.
Column 4, line 53, "III-VIII-V" should read --III-V--.
Column 4, line 58, "III-VIII-V" should read --III-V--.
Column 5, line 6, "III-VIII-V" should read --III-V--.
Column 5, line 12, "III-VIII-V" should read --III-V--.
Column 5 line 45, "III-VIII-V" should read --III-V--.
Column 6, line 40, "III-VIII-V" should read --III-V--.
Column 6, line 42, "III-VIII-V" should read --III-V--.
Column 8, line 2, "III-VIII-V" should read --III-V--.
Column 9, line 40, "III-VIII-V" should read --III-V--.
Column 10, line 22, "III-VI-V" should read --I-V--.
Column 10, line 23, "III-VIII-V" should read --III-V--.
Column 10, line 28, "III-VI-V" should read --I-V--.
Column 10, line 32, "III-VI-V" should read --I-V--.
Column 10, line 36, "III-VI-V" should read --I-V--.
Column 10, line 37, "III-VI-V" should read --I-V--.
Column 10, line 44, "III-VIII-V" should read --III-V--.
Column 10, line 46, "III-VIII-V" should read --III-V--.
Column 10, line 54, "III-VIII-V" should read --III-V--.
Column 11, line 21, "III-VIII-V" should read --III-V--.
Column 11, line 22, "III-VIII-V" should read --III-V--.
Column 11, line 57, "III-VIII-V" should read --III-V--.
Column 11, line 59, "III-VIII-V" should read --III-V--.
Column 12, line 6, "III-VIII-V" should read --III-V--.
Column 12, line 19, "III-VIII-V" should read --III-V--.
Column 12, line 20, "III-VIII-V" should read --III-V--.
Column 12, line 25, "III-VIII-V" should read --III-V--.
Column 12, line 32, "III-VIII-V" should read --III-V--.
Column 12, line 35, "III-VIII-V" should read --III-V--.

UNITED STATES PATENT AND TRADEMARK OFFICE
CERTIFICATE OF CORRECTION

PATENT NO. : 7,180,103 B2
APPLICATION NO. : 10/948897
DATED : February 20, 2007
INVENTOR(S) : Jeff D. Bude et al.

It is certified that error appears in the above-identified patent and that said Letters Patent is hereby corrected as shown below:

Column 12, line 36, "III-VIII-V" should read --III-V--.
Column 12, line 50, "III-VIII-V" should read --III-V--.
Column 13, lines 9-10, "III-VIII-V" should read --III-V--.
Column 13, line 10, "III-VIII-V" should read --III-V--.
Column 14, line 2, "III-VIII-V" should read --III-V--.

Signed and Sealed this

Eighteenth Day of December, 2007

JON W. DUDAS
*Director of the United States Patent and Trademark Office*